United States Patent [19]

Berg et al.

[11] Patent Number: 5,756,380
[45] Date of Patent: May 26, 1998

[54] METHOD FOR MAKING A MOISTURE RESISTANT SEMICONDUCTOR DEVICE HAVING AN ORGANIC SUBSTRATE

[75] Inventors: Howard M. Berg, Scottsdale; Sankaranarayanan Ganesan, Chandler; Gary L. Lewis, Peoria; George W. Hawkins, Gilbert, all of Ariz.; James W. Sloan; Scott C. Bolton, both of Austin, Tex.

[73] Assignee: Motorola, Inc., Schaumburg, Ill.

[21] Appl. No.: 556,782

[22] Filed: Nov. 2, 1995

[51] Int. Cl.[6] ................................. H01L 21/60
[52] U.S. Cl. .................. 438/126; 438/125; 438/127
[58] Field of Search ........................ 438/111, 112, 438/121, 124, 125, 126, 127

[56] References Cited

U.S. PATENT DOCUMENTS

| | | | |
|---|---|---|---|
| 4,028,135 | 6/1977 | Vig et al. | 134/1 |
| 4,159,221 | 6/1979 | Schuessler | 156/285 |
| 4,507,672 | 3/1985 | Potember | 438/99 |
| 4,769,399 | 9/1988 | Schenz | 523/213 |
| 4,816,426 | 3/1989 | Bridges et al. | 438/112 |
| 5,011,786 | 4/1991 | Isoda et al. | 438/89 |
| 5,072,283 | 12/1991 | Bolger | 357/72 |
| 5,143,785 | 9/1992 | Pujol et al. | 428/352 |
| 5,150,193 | 9/1992 | Yasuhara et al. | 357/70 |
| 5,173,766 | 12/1992 | Long et al. | 257/687 |
| 5,175,060 | 12/1992 | Enomoto et al. | 428/620 |
| 5,274,913 | 1/1994 | Grebe et al. | |
| 5,296,738 | 3/1994 | Freyman et al. | 257/684 |
| 5,436,203 | 7/1995 | Lin | |
| 5,469,333 | 11/1995 | Ellerson et al. | |
| 5,473,814 | 12/1995 | White | |

FOREIGN PATENT DOCUMENTS 0 350 021   10/1990   European Pat. Off. .
59-114832   12/1982   Japan .
2-275618   4/1989   Japan .

OTHER PUBLICATIONS

G.S. Ganesan, et al.; "Characterizing Organic Contamination in IC Package Assembly;" Int'l & Electronics Packaging Society Conf., Sep. 12–15, 1993; pp. 564–579.

G.S. Ganesan, et al.; "Level 1 Crackfree Plastic Packaging Technology;" Proceed. of the '95 45th Electronic Components & Tech. Conf.; pp. 450–454; (1995).

G.S. Ganesan, et al.; "Model and Analyses for Solder Reflow Cracking Phenomenon . . . ;" 43rd Electronic Components & Technology Conf; pp. 653–660; (1993).

(List continued on next page.)

*Primary Examiner*—Kevin Picardat

[57] ABSTRACT

A method for making moisture resistant semiconductor devices having organic substrates targets each of the potentially critical interfaces within a semiconductor device having the potential for delamination and cracking. An organic substrate (110) is designed to include a solid pad (116) having a chemically created oxide layer (118) formed thereon. A silicone-based die attach material (108) is dispensed and gelled very soon after dispensing to prevent excessive bleed. A semiconductor die (102) is mounted to the substrate after undergoing a cleaning operation to remove contaminants from the backside of the die. Prior to molding compound encapsulation and subsequent to die attach material cure, the substrate is cleaned to improve adhesion to the die attach material fillet (122). In practicing these operations, the following interfaces are targeted and their adhesion characteristics are improved: die attach material to die pad; die attach material to die; molding compound to die pad; and molding compound to die attach material.

21 Claims, 2 Drawing Sheets

OTHER PUBLICATIONS

G. Hawkins, et al.; "The PBGA: A Systematic Study of Moisture Resistance;" International Electronics Packaging Society Conference; Sep. 25–28, '94; pp. 588–603.

G. Lewis, et al.; "Role of Materials Evolution in VLSI Plastic Packages in Improving Reflow Soldering Performance;" IEEE Components, Hybrids & Manuf. Tech. Soc. Conf.; May 1–4, '94; pp. 177–185.

G.S. Ganesan, et al.; "Contact Angles as a Measure of Interfacial . . . ;" Proceedings of the Internat'l Intersociety Electronic Packaging Conf. '95; EEP—vol. 10–2; pp. 717–722; (ASME 1995).

H. Berg, et al.; "Strategies for Improving PBGA Moisture Performance;" Jul. 11, 1995 SEMICON/WEST Tech. Educ. Prog., Pkg. Tech.; pp. 1–9 with attach. Figs. 1–9 (as prep. by authors).

J.M. Pujol, et al.; "Electroconductive Adhesives: Comparison of Three Different Polymer Matrices, Epoxy, Polyimide and Silicone;" J. Adhesion, 1989, vol. 27, pp. 213–229 (1989).

R.C. Benson, et al.; "Volatile Species From Conductive Die Attach Adhesives;" Electronic Components Conference, May 22–24, 1989; pp. 301–308 (1989).

METHOD FOR MAKING A MOISTURE RESISTANT SEMICONDUCTOR DEVICE HAVING AN ORGANIC SUBSTRATE

CROSS-REFERENCE TO RELATED APPLICATION

The present application is related to a commonly-assigned co-pending application by Howard M. Berg et al. entitled, "Method for Packaging a Semiconductor Chip and Package Formed," Ser. No. 08/333,563, filed Nov. 2, 1994.

FIELD OF THE INVENTION

The present invention relates to the manufacture of semiconductor devices in general, and more particularly to the manufacture of semiconductor devices which are packaged with an organic substrate.

BACKGROUND OF THE INVENTION

Plastic ball grid array (PBGA) packages, also referred to as overmolded pad array carriers (OMPACs), are becoming a widely utilized package type for semiconductor devices. These package types have an advantage over conventional leaded semiconductor devices in that PBGAs enable surface mount capability with a reduced footprint. PBGA packages utilize an array of solder balls for external connections to the board as opposed to peripherally arranged leads. The array configuration allows the same die with the same pin-out to be mounted to a board while taking up less space than the same die packaged in a conventional leaded package.

While PBGAs are desirable from a size perspective, the packages still suffer from a problem common to most plastic encapsulated semiconductor devices. This problem is sometimes referred to as a "popcorn" or package cracking problem. The popcorn problem relates to moisture absorption of the package, both by the plastic material used to encapsulate the semiconductor die, and in PBGAs, by an organic substrate which is used in place of a conventional lead frame. In mounting a plastic packaged device to a board, a solder reflow process performed at around 230° C. causes moisture which has been absorbed in the plastic to vaporize. The expansion of absorbed moisture into steam creates internal stresses within the package. If the amount of moisture absorbed in the package is sufficient, the expansion during solder reflow creates internal stresses greater than the package can withstand. Excess stress is relieved by internal delaminations and internal cracking, which in some cases is so severe that the noise of the cracking resembles popcorn popping (thus the name "popcorn" problem).

Various attempts to reduce the susceptibility of plastic packaged devices have been proposed and utilized. One of the most effective techniques is to minimize the amount of moisture which is absorbed by the package. This has been accomplished by baking the semiconductor devices after assembly, and then dry-packing the devices in moisture resistant packaging containers along with a desiccant. Upon opening the container, the user is instructed to mount the devices to their board within, for example, 24 hours to prevent excessive moisture absorption from the ambient. While the dry-packing technique is effective, it is burdensome and costly.

Non-dry-packing techniques have focused on improving the adhesion between a metal lead frame and the plastic molding compound. For example, the flag or die pad area of the lead frame has been reduced to minimize the amount of metal in the package, or holes or dimples have been included in the die pad or leads, also in an effort to improve adhesion.

However, in PBGA packages, there is no metal lead frame to be altered. In a conventional PBGA package, an organic substrate is used in place of a stand-alone lead frame. The bulk of the organic substrate is formed of a resin material, and includes various conductive layers and vias to provide signal, power, and ground lines. A die is mounted to a top surface of the organic substrate and is connected to the signal, power, and ground lines by, for example, wire bonds. The die, wire bonds, and portions of the top surface of the organic substrate are then molded with a conventional plastic molding compound. Solder balls are then attached to the bottom of the organic substrate to provide the external input and output (I/O) connections. Because PBGA packages do not include stand alone metal lead frames, many prior art techniques which have been proposed cannot be utilized in PBGAs. Moreover, many of the prior art techniques proposed do not achieve a sufficiently high level of moisture resistance. Ideally, semiconductor manufacturers would like to entirely eliminate the dry-packing process and end users would like to eliminate time restraints imposed on the device "floor life" prior to mounting to a board once removed from the dry-pack. Yet, none of the proposed improvements to moisture resistance have been able to achieve this goal. Accordingly, a process for improving the moisture resistance of plastic packages is desired.

DETAILED DESCRIPTION OF A PREFERRED EMBODIMENT

Figure 1:
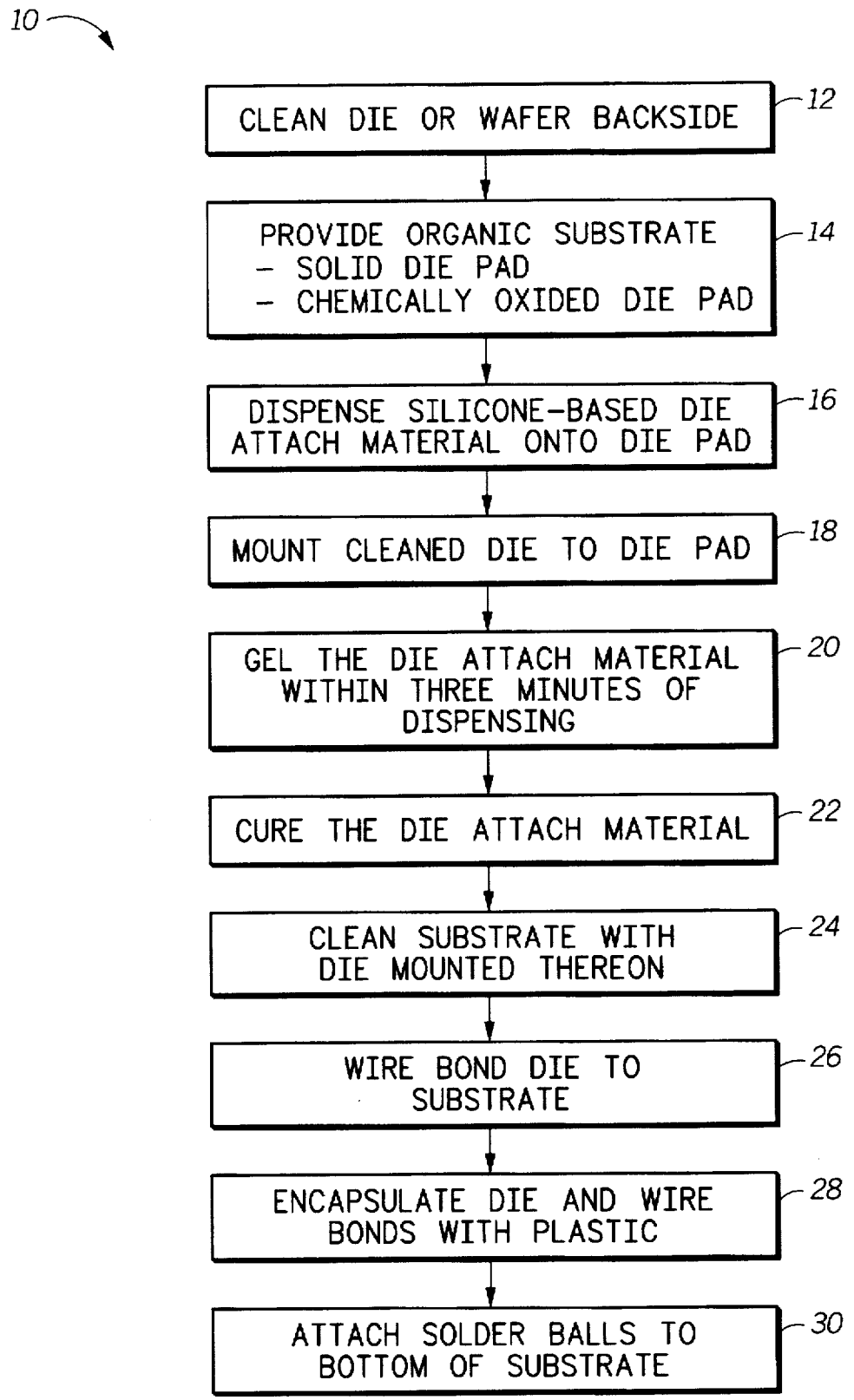
FIG. 1 is a process flow for making a semiconductor device having an organic substrate in accordance with one embodiment of the present invention.

Generally, the present invention is a series of processing steps used for manufacturing PBGA packages having an organic substrate. Each of the key steps within the process is targeted to improve the adhesion between one particular interface within the final package. One drawback to many of the prior art processes proposed for improving moisture resistance and package cracking has been that these processes focus only on one interface in the final package. Interfaces within the package are where delamination and cracking typically occur because interfaces are the weakest points within the package. As mentioned earlier, in conventional leaded devices much of the prior art work has focused on the interface between a plastic molding compound and a metal lead frame which is used in the package. However, merely trying to improve the adhesion between the molding compound and the metal lead frame is not enough. Nor is it enough in PBGA packages to focus only upon the interface between the molding compound and the organic substrate.

In practicing the present invention, each of the potentially faulty interfaces within a PBGA package are identified and targeted with a particular processing step to significantly improve the overall resistance to package cracking upon mounting the device to a user's board. A first interface is that between the semiconductor die and the die attach material used to mount the die to the organic substrate. In accordance with the present invention, the adhesion at this interface is enhanced by adding a cleaning step (e.g. an ultraviolet and ozone cleaning operation) to clean the backside of the die. A second interface is the interface between the die attach material and the organic substrate itself. In accordance with the present invention, the adhesion at this interface is enhanced in three ways. First, the metallized die pad on which the semiconductor die is mounted is made to be a solid metal area. Second, the solid metal die pad is chemically treated to form an oxide, (e.g. cuprous or cupric oxide) across the entire die pad surface. Third, the die attach material used is a silicone-based die attach material, as opposed to an epoxy-based die attach material. Together, the silicone-based die attach material and the chemically oxided die pad form a very strong, low-moisture interface beneath an entirety of the die upon mounting. A third interface is that between the plastic molding compound and portions of the die pad which extend beyond the semiconductor die. While the oxided surface of the die pad alone would improve adhesion at this interface, the presence of a "bleed" zone on the die pad (where low molecular weight constituents of the die attach material begin to separate from the bulk of material) interferes with the ability of the molding compound to adhere to the oxided die pad. Strong adhesion of the molding compound to the oxided die pad can be maintained by gelling the die attach material very soon after dispensing to prevent excessive bleed. Finally, a fourth interface of concern is that between the die attach material and the molding compound. This interface occurs in the area of a semiconductor device known as a "fillet" which surrounds the die perimeter. In accordance with the present invention, the fillet interface adhesion is enhanced by cleaning the semiconductor device after the die has been mounted and after the die attach material has been cured (e.g. using a UV/ozone cleaning operation). Thus, by focusing on the multiple interfaces within a semiconductor device which can potentially lead to package cracking, the present invention achieves moisture resistance performance higher than other levels attained with prior art techniques.

These and other features and advantages of the present invention will be more clearly understood from the following detailed description taken in conjunction with the accompanying drawings. It is important to point out that the illustrations may not necessarily be drawn to scale, and that there may be other embodiments of the present invention which are not specifically illustrated.

Figure 2:
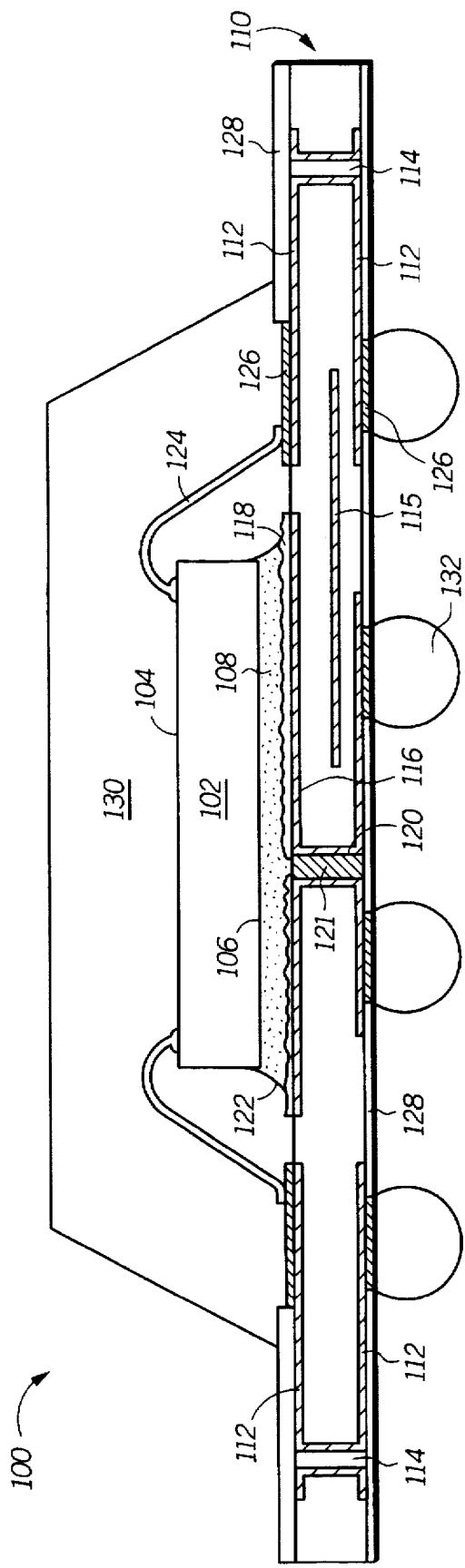
FIG. 2 is a cross-sectional illustration of a plastic encapsulated semiconductor device having an organic substrate, also referred to as a PBGA, made in accordance with the process flow of FIG. 1 and in accordance with one embodiment of the present invention.

FIG. 1 shows a process flow 10 used for making a semiconductor device having an organic substrate in accordance with one embodiment of the present invention. FIG. 2 illustrates in cross-section a semiconductor device 100 made in accordance with process flow 10. Throughout the discussion of process flow 10, various components of semiconductor device 100 will be referenced. Therefore, it will be helpful for the reader to refer to both FIGS. 1 and 2 together.

Process flow 10 begins with a cleaning step 12, which is used to clean the backside or inactive surface of a semiconductor die 102. Semiconductor die 102 includes an active surface 104 having integrated circuitry formed thereon, and an inactive surface 106 made of the bulk semiconductor material, e.g. silicon or gallium arsenide. As mentioned earlier, one interface in a semiconductor device which has the potential for delamination, and therefore the potential for causing package cracking, is the interface between the backside of the semiconductor die and the die attach material. As illustrated in FIG. 2, this interface is where inactive surface 106 of the semiconductor die meets a die attach material 108. Cleaning step 12 is designed to enhance the adhesion at this interface by providing a very clean back surface of the die. In a preferred form, cleaning step 12 is performed in an environment of ultraviolet radiation and ozone, hereinafter referred to as a UV/ozone clean. UV/ozone cleaning is particularly useful for removing carbon and carbon compounds often found on the backside of die as remnants from an adhesive tape used to hold the die while in wafer form during a dicing or sawing operation. The UV/ozone cleaning process is a photosensitized oxidation process. Optical energy generated during a UV/ozone cleaning operation is used to oxidize any carbon residue which may be present, and at lower temperatures than many other cleaning alternatives. Low temperature processing is desirable to minimize negative effects that the cleaning operation may have on the electrical characteristics of the semiconductor die.

One suitable UV/ozone cleaning process for cleaning inactive surface 106 involves the use of a conventional mercury discharge lamp as the source of ultraviolet radiation. Mercury discharge lamps have principle radiation output at 184.9 nanometers (nm) and 253.7 nm. In an oxygen ($O_2$) environment, the 184.9 nm output is absorbed by $O_2$ molecules and creates atomic ozone ($O_3$). The 253.7 nm output serves to break molecular bonds of any contaminants which may exist on the surface to be cleaned. Upon breaking the molecular bonds of the contaminants, interaction between the contaminant molecules and the $O_3$ molecules in the ambient readily occurs, thereby removing the contaminants from the surface being cleaned.

While UV/ozone cleaning is preferred, it is recognized that other methods for cleaning the backside or inactive surface 106 of the semiconductor die may be adequate for insuring adhesion at the interface between the die and die attach material. Rather than specifying cleaning step 12 by a particular type of cleaning method, it is perhaps more useful to specify a degree of cleanliness which will provide an effective level of adhesion. In practicing the present invention, an appropriate level of cleanliness on the backside of the die surface can be measured using a contact angle endpoint detection process. In other words, the backside of the die is cleaned until deionized water dispensed on the backside of the die, for example 2–4 μl of deionized water, has a contact angle of less than a specified angle. Generally, cleaning of the backside of die 102 should be accomplished until a contact angle less than or equal to 10° is achieved, and preferably until a contact angle of less than or equal to 8° is achieved. Measurement of the contact angle can be done accordingly to any of the known measuring techniques, including measurement by use of a goniometer. It is also noted that while cleaning step 12 has herein referred to cleaning the backside of the die, the cleaning may occur in wafer form, prior to the die being singulated.

After cleaning step 12, semiconductor die 102 is ready to be mounted to an organic substrate 110. In process flow 10, this corresponds to a providing step 14. In conventional PBGA packages, and as suitable in practicing the present invention, organic substrate 110 is primarily composed of a epoxy resin, for example bismaleimide triazine (BT) resin. Additional components of substrate 110 are various conductive layers, typically formed from copper, which has been laminated to the BT resin and etched in a desired pattern. As illustrated in FIG. 2, and in accordance with conventional practices, a copper layer is used to form a plurality of conductive traces 112 on both a top surface and a bottom surface of the substrate. On the top surface, conductive traces 112 are used to establish electrical connection to the semiconductor die. The conductive traces on the top surface are then routed to corresponding conductive traces on the bottom surface through a plurality of conductive vias 114. Substrate 110 may also include internally embedded conductive patterns, for example a power plane or a ground plane 115. Internally embedded conductive layers can instead be used as an additional signal layer. As thus far described, organic substrate 110 is fabricated in accordance with conventional practices.

In addition to the above mentioned features of organic substrate 110, the substrate further includes a die receiving pad 116, also referred to simply as a die pad. Die pad 116 is the area of the substrate on which semiconductor die 102 will be mounted with use of die attach material 108. Accordingly, another interface, namely that between die attach material 108 and die pad 116 becomes the focus of another processing step used for improving adhesion within the package in accordance with the present invention. Die pad 116 will be made from the same conductive layer used to form conductive traces 112. Accordingly, the material will most likely be copper. However, in accordance with the present invention, an additional layer, specifically a chemically created oxide layer 118 is provided across the entire surface of die pad 116. Oxide layer 118 is chemically formed, e.g. by immersing the substrate in a caustic, oxidizing solution, to provide a sufficiently rough surface to improve adhesion between the die pad and the die attach material 108. Thermally grown oxide layers typically have comparatively smooth surfaces which do not maximize the adhesion of the die pad to the die attach material. Another characteristic of oxide layer 118 is that it is chemically compatible with a later dispensed die attach material. In preferred embodiments of the present invention, oxide layer 118 is either cuprous ($Cu_2O$) or cupric (CuO) oxide, also referred to as brown oxide and black oxide, respectively.

Figure 3:
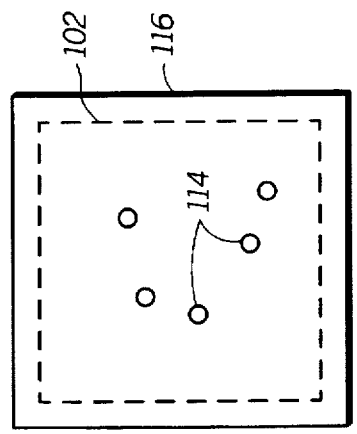
FIG. 3 is a top down view of a die receiving pad of the organic substrate illustrated in FIG. 2.

In addition to the oxide layer on die pad 116, another aspect of the die pad which has an impact on the susceptibility of the packaged device to crack relates to the pattern of the die pad. In accordance with the present invention, the die pad is made to be a solid pad area, with the exception of any vias which might be formed in the die receiving area of the substrate. FIG. 3 illustrates better what is meant by "solid" metal or die pad area. Die pad 116 is illustrated in FIG. 3 from a perspective looking down upon the top surface of organic substrate 110. As shown, die pad 116 is square or rectangular (i.e. a quadrangle) to closely match the shape of the die with a small degree of overhang. An outline of where semiconductor die 102 would be positioned on die pad 116 is shown by the dashed line. From FIG. 3 it is apparent that upon placing the die 102 within the bounds of die pad 116, the entire area of the die will be sitting entirely over a metallized portion of the substrate, as opposed to lying above a resin portion of the substrate.

In accordance with the present invention, it is preferred that the die be mounted only over metal because metal blocks the flow of moisture from the organic substrate to the die attach material. In some conventional PBGA packages, the die pad onto which the die is mounted has been designed using a variety of shapes, including a star burst pattern, a union-jack pattern, or the like. At one time, it was believed that minimizing the amount of metal beneath the semiconductor die actually improved the packages resistance to delamination and cracking. However, inventors of the present invention recognize that by removing the metallization in the die receiving area of the substrate, the base resin material of the substrate will directly underlie the semiconductor die. The base resin material of the substrate, however, readily absorbs water. Without a solid metallization layer under the die to block the moisture, the device is more prone to delamination than if a solid metal die pad area were present.

While ideally the die pad should be completely continuous and solid beneath the die, this is unlikely to occur if one chooses to include thermal vias or conductive vias within the die pad area. As FIG. 3 indicates, conductive vias 114 may be present within the die pad or die receiving areas. To the extent that these conductive vias exist, the die pad metallization is not continuous due to the manner in which vias are traditionally formed. In conventional organic substrate manufacturing processes, vias are sometimes included in the die pad area of the substrate, usually either to serve as a source of heat dissipation or to connect the die to a ground plane in the substrate. Most vias are formed by a drilling operational that occurs subsequent to the lamination of copper layers on the top and bottom surfaces of the substrate. Accordingly, any vias which are drilled through the substrate will also be drilled through the copper conductive layers. If drilled through the die pad, vias will create small holes in the pad, as shown in FIG. 3. After drilling, the vias are plated to establish electrical conductivity through the substrate. In practicing the present invention, it is desirable to have the metallization of the die pad area to be continuous or solid throughout the die receiving area. However, it is acknowledged that there is sometimes the need to form either thermal vias or conductive vias in the die pad area. Accordingly, the present invention can accommodate traditional via formation processes by permitting the die pad to be discontinuous only where these vias occur within the die receiving area.

It is noted that while FIG. 2 illustrates a thermal via 120 included within device 100 within the die pad area, use of thermal vias are not a requirement of the present invention. However, if thermal vias are included in a design and are located directly beneath the semiconductor die, it is recommended that these vias be filled, for example by a solder material 121 as illustrated, rather than being left open as is done in many prior art devices. By filling the thermal vias with solder or other material, the likelihood that water can migrate to any of the interfaces at the die pad, die attach material, or die backside area is significantly reduced. Furthermore, filling any thermal vias prevents voiding in the die attach material during cure, since there is no air in the via to expand and escape during the die attach curing operation.

After providing the organic substrate having the chemically created oxide layer 118 and the solid die pad 116 as described above, a next step in process flow 10 is a dispensing step 16, wherein a silicone-based die attach material is dispensed onto die pad 116. Die attach material 108 has been previously been discussed in reference to enhancing the adhesion at the interface between inactive surface 106 of the die and die attach material 108. In accordance with the present invention, die attach material 108 is a particular die attach material, namely a silicone-based die attach material. While silicone-based die attach materials in general will provide improved moisture resistance as used in accordance with the present invention, particularly if used in conjunction with an oxided die pad, particular silicone-based materials which are suitable include Dow Corning's DC6501 unfilled silicone die attach, Dow Corning's DC6531 silver filled silicone die attach, and Zymet's Z-6000 silver filled silicone die attach. Most conventional die attach materials are epoxy-based materials. Epoxy-based materials have excellent adhesion properties to silicon, and therefore have excellent adhesion to the backside of semiconductor die. However, epoxy-based die attach materials have less stellar adhesion properties with respect to metallized surfaces than with respect to oxided surfaces. In accordance with the present invention, a silicone-based die attach material is used to enhance the adhesion strength at the interface between die attach material 108 and oxide layer 118 of the die pad. While silicone-based die attach materials do not adhere as well to silicon as epoxy-based die attach materials, more than adequate adhesion between inactive surface 106 of semiconductor die 102 and die attach material 108 can be achieved with the use of cleaning step 12 as discussed previously.

A further advantage in using silicone-based die attach materials is that silicone-based materials do not absorb moisture as readily as epoxy-based materials, thereby further reducing the likelihood of catastrophic delaminations and cracking during a surface mount operation to attach the device to a user's board. Furthermore, the use of a silicone-based die attach results in better thermal fatigue properties of semiconductor device 100 upon mounting to a users substrate. Silicone-based die attach materials have a lower modulus of elasticity as compared to epoxy-based materials. As such, a silicone-based die attach material will act to decouple the chip from the substrate during thermal excursions of the device such that the die and substrate can expand and contract independently of one another for an improved lifetime, despite the thermal expansion property mismatch between the die and the substrate materials.

As illustrated in process flow 10 of FIG. 1, after dispensing the silicone-based die attach material, a next step in the process is a mounting step 18. Semiconductor die 102 is centered on the die pad and pressed against the pad to cause the die attach material to uniform spread underneath the entire die. A result of the mounting step is the formation of a fillet 122 of die attach material around a perimeter of the die. It is desirable for the fillet to partially extend up a side of the semiconductor die, as illustrate in FIG. 2, to provide a sufficiently strong connection between the semiconductor die and the die attach material. The extent of the fillet can be controlled by the volume of die attach material dispensed and the amount of pressure applied to the die during mounting.

After mounting the semiconductor die, a gelling step 20 is performed to minimize the amount of resin bleed from the die attach material after dispensing. Regardless of the type of die attach material used, be it epoxy-based or silicone-based, upon dispensing the material low molecular weight constituents (e.g. solvents and resin constituents) of the material begin to separate from the higher molecular weight constituents and spread radially outward. This separation phenomenon is referred to in the industry as "bleed." Traditionally, bleed was not thought to have any impact on the resistance a package has to delamination and package cracking. However, inventors of the present invention recognized that the extent of bleed does in fact contribute to the extent of delamination and cracking within a packaged device. More specifically, it has been found that molding compounds which are used to encapsulate semiconductor die do not adhere to areas of a substrate or a lead frame where bleed has occurred.

To minimize the extent of bleed after dispensing die attach material 108, an embodiment of the present invention gels the die attach material very soon after the material has been dispensed to minimize the bleed. Preferably, the die attach material is gelled within three minutes of dispensing, and more preferably gelling occurs within one minute of dispensing. It is noted that gelling has to occur after the die has been attached to the die pad. Accordingly, dispensing step 16, mounting step 18, and gelling step 20, all must occur in quick succession. Gelling is performed by heating the device to a temperature of between 150°–200° C. The time necessary to affect the gelling process, and therefore prevent excessive bleed, will vary depending upon the gelling temperature used, but in any event need not be more than 60 seconds. Examples of suitable gelling steps for use with Dow Corning's DC6501 silicone die attach material are a 15 second gel at 200° C., or a 45 second gel at 150° C.

It is noted that gelling parameters will also vary depending on the particular die attach material used. Therefore, rather than defining gelling step 20 by the time and temperatures of the operation, perhaps a more suitable method of defining the requirements of this step are to define the limits of an acceptable amount of bleed. After dispensing a die attach material, one can visually observe the extent of bleed. There will be a defined ring of bleed surrounding the bulk of the die attach material. Controlling the width or dimension of this ring of bleed is important for controlling the extent of delamination and cracking in a packaged device. Inventors of the present invention have recognized that any delamination within a packaged semiconductor device which is 20 mils wide or wider (which corresponds to 510 microns wide or wider) will result in a catastrophic package crack upon mounting the device to a user's board using a solder reflow process having a temperature of 230° C. Delaminated areas which are 10 mils wide or wider (250 microns wide or wider) were found to likely result in package cracks during solder reflow. Because the adhesion between a plastic molding compound used to encapsulate the die and the bleed zone is so weak, delamination in this bleed zone will probably occur during a solder reflow process. Therefore, if the bleed zone is controlled to be less than or equal to 20 mils (less than or equal to 510 microns), and preferably less than or equal to 10 mils (less than or equal to 250 microns), any delamination which may occur should not prove fatal to the device. Accordingly any gelling step which is performed in accordance with the present invention can be defined as a thermal operation performed soon after dispensing the die attach material and prior to the formation of a bleed zone around the die attach material in excess of 10 or 20 mils (250 or 510 microns).

As process flow 10 of FIG. 1 illustrates, a next step for manufacturing semiconductor device 100 is a curing step 22. After mounting semiconductor die 102 and gelling the die attach material 108, the die attach material is cured in accordance with recommended curing cycles as provided by the supplier of the die attach material. For example, if using Dow Corning's DC6501 silicone die attach material, a recommended curing cycle is a one hour cure at 150° C.

As is apparent from process flow 10, gelling step 20 and curing step 22 are separate steps within the fabrication process, although both involve thermal processing, and both are directed to affecting the die attach material. The distinction between the two steps are that the gelling step is performed very soon after dispensing the material on the substrate for the purpose of minimizing the extent of bleed. Once the die attach material has been gelled, the semiconductor die as mounted on the substrate can sit for an indefinite period of time prior to encapsulation with a molding compound. This is because the resin bleed has been controlled, and "idle time" will not have any degrading effects on the final packaged device's resistance to delamination and cracking. The curing step, on the other hand, is unrelated to bleed. The curing step is designed to remove solvents which are included within the die attach material to facilitate the viscosity of the material for dispensing, and to cross link the polymers to make it a strong cohesive material. Solvents are an unwanted component of the die attach material in a final packaged semiconductor device, and therefore must be driven off by an elevated temperature operation known as a cure. Cross linking joins the short polymer chains into a solid. The particular temperatures and times needed to cure a die attach material will depend upon the die attach material being used. The supplier of the die attach material is likely to have a recommended curing cycle. It is noted that there are die attach materials referred to as "snap cure" materials. Snap cure materials refer to materials which can be cured very quickly, for example, under two minutes. Again, however, the snap curing process should not be confused with the gelling step 20 as used in accordance with the present invention.

After the semiconductor die has been mounted and the die attach material cured, device 100 is ready to be wire bonded and encapsulated with a plastic molding compound. However, in accordance with the present invention, a cleaning step 24 is performed prior to encapsulation. Inventors of the present invention have discovered that there is another interface with the potential for delamination and package cracking, namely the interface between die attach material 108 and the plastic molding compound after it is molded. This interface can be referred to as the fillet area of the die attach material. As illustrated in FIG. 2, a fillet 122 is formed around a perimeter of the die as a result of the die attach process. Adhesion between the die attach material, be it an epoxy-based or silicone-based material, and a plastic molding compound is relatively poor. Therefore in accordance with the present invention, cleaning step 24 is performed on substrate 110 with semiconductor die 102 mounted thereon. Cleaning step 24 is designed to remove contaminants deposited during the die attach cure process and to activate the surface of the die attach material (e.g. creating loose bonds) to improve adhesion.

In a preferred embodiment of the present invention, the cleaning of substrate 110 is accomplished using a UV/ozone cleaning process like that described above in reference to cleaning step 12. However, unlike cleaning step 12, a contact angle and point detection process is unlikely to be appropriate to determine the extent cleaning step 24 should be performed. Instead, it is recommended that at least two minutes of cleaning occur.

Once cleaning step 24 is complete, a wire bonding step 26 is performed to electrically couple a plurality of bonding pads of the semiconductor die to conductive traces 112 on the top surface of substrate 110. The terminal portions of conductive traces 112 which end near the die perimeter are configured to include bonding pads, such that the electrical connection is between the bonding pads of the die to the bonding pads of the substrate. As FIG. 2 illustrates, wire bonds 124 extend from bonding pads on the active surface of the die to the bonding pads at the terminal portions of the conductive traces. Moreover, FIG. 2 illustrates that conductive traces 112 have a plating layer 126 deposited over the bonding pad portions of the conductive traces. Plating the conductive traces and other metal features of substrate 110 is a common practice. Typically, copper traces or metallized areas are plated with gold. Plating is performed because copper has a tendency to form a native oxide layer which degrades the electrical conductivity of the material and the ability to make connections thereto. Therefore, a metal which does not readily oxidize in air, such as gold, is plated on the copper to prevent such oxidization.

It is noted that in accordance with the present invention, die pad 116 is not plated. This is intentional because oxide layer 118 could not readily be formed on the die pad if a gold plating layer were present. To form oxide layer 118 on the die pad without forming an oxide on the bonding pad portions of the conductive traces, and likewise to form plating layer 126 on the conductive traces without forming a plating on the die pad, various temporary and permanent masking techniques which are known within the art of substrate fabrication can be used. For example, as illustrated in FIG. 2 a permanent masking layer often referred to as a resist mask 128 is selectively positioned on both the top surface and bottom surface of substrate 110. On the top surface, resist mask 128 preferably covers the entire surface other than those portions of conductive traces 112 which are to be plated and die pad 116. Likewise, on the bottom surface, resist mask 128 is continuous but for openings in the mask used to expose conductive traces 112 which will subsequently be plated. Plating of the conductive traces on the bottom surface of substrate 110 is performed to enable subsequent attachment of solder balls.

After wire bonds have been made, a resin or plastic package body 130 is formed by an encapsulating step 28. Encapsulation can be performed with any of the commercially available electronic grade molding compounds. Likewise, conventional injection or transfer molding can be used. Glob top encapsulation, wherein a mold cavity is not used to define the final shape of the package body, can also be used in accordance with the invention.

After the formation of package body 130, an attaching step 30 is performed to attach a plurality of solder balls 132 to the bottom surface of substrate 110. The solder balls are positioned in array configuration, thus the name plastic ball grid array. One suitable method for attaching solder balls 132 is to apply a flux to the bottom of substrate 110, and to use a vacuum pick-up tool to position an array of pre-formed solder balls onto corresponding plated or pad areas which are exposed through resist mask 128. A reflow operation can then be performed to metallurgically bond each of the solder balls to the plating or conductive trace metallurgy.

In using the present invention, PBGA semiconductor devices can be repeatedly manufactured to a Level 2, and even Level 1, moisture sensitivity as defined by JEDEC Test Method A112. JEDEC (the Joint Electronic Development Engineering Council) establishes standardized test and performance method so that all semiconductor devices can be measured against the same standards. The JEDEC standard for moisture sensitivity defined in Test Method A112, which is summarized below in the table.

| LEV-EL | MOISTURE TEST/SOAK CONDITIONS | CUSTOMER HANDLING REQUIREMENTS |
|---|---|---|
| 1 | 85° C. & 85% RH for 168 hours | No Dry-Pack; Indefinite Storage at 30° C. & 90% RH |
| 2 | 85° C. & 60% RH for 168 hours | Dry-Pack; Indefinite Storage at 30° C. & 60% RH |
| 3 | 30° C. & 60% RH for 192 hours | Dry-Pack; Floor Lifetime less than 168 hours |
| 4 | 30° C. & 60% RH for 96 hours | Dry-Pack; Floor Lifetime less than 72 hours |
| 5 | 30° C. & 60% RH for 72 hours | Dry-Pack; Floor Lifetime less than 48 hours |
| or | 30° C. & 60% RH for 48 hours | Dry-Pack; Floor Lifetime less than 24 hours |

Ideally, all semiconductor manufacturers would like to achieve Level 1 moisture sensitivity, for such an achievement results in no need to dry-pack the devices and no need for the end user to be concerned about how long the product sets on the floor prior to mounting. As shown in the table, to a Level 1 classification, the devices must withstand 168 hours in an 85% relative humidity environment at 85° C. For devices which can withstand these soak conditions, the devices can then be stored indefinitely at room temperature even in a 90% relative humidity environment without need for dry-packing. Level 2 is the next best performance rating, wherein semiconductor devices are soaked for 168 hours in a 60% relative humidity environment at 85° C. Devices withstanding Level 2 soak conditions can be indefinitely stored at room temperature in an environment of 60% relative humidity; however, a semiconductor manufacturer is still required to dry-pack the devices in shipping them to the customer. Levels 3, 4, and 5 performance ratings are undesirable particularly from a user's perspective because the user must monitor the time from which the devices are removed from the dry-packs to the time the devices undergo a surface mounting or solder reflow operation. This "floor lifetime" is limited to a particular number of hours for each of Level 3, 4, and 5. In particular, the floor life time must be held to less than 168 hours for Level 3, to less than 72 hours for Level 4, and to 48 or 24 hours depending upon which of the Level 5 test conditions were performed. One practicing the present invention can achieve a great competitive advantage over other device manufacturers, because at the present time no Level 1 PBGA devices having an low-cost organic substrate are available on the market.

By identifying each of the potentially weak interfaces which may lead to delamination and package cracking, and by directing specific processing steps to improve the adhesion at each of these interfaces, a process in accordance with the present invention results in semiconductor devices having exceptional resistance to delamination and package cracking. While ideally each of the interfaces addressed in this description and each of the respective processes used for improving the adhesion at the interfaces is performed, a semiconductor manufacturer may choose to mix and match any of these steps to achieve some improvement in their manufacturing process. However, it is believed that at least a few of the processing steps or interfaces targeted are the most important ones to concentrate on. For example, it is believed that utilization of a chemically oxided die pad in conjunction with a silicone-based die attach material is one of the most effective combinations for reducing the extent of package delamination and cracking. Next in order of effectiveness is believed to be the use of a solid die pad, rather than allowing the semiconductor die to be mounted directly over and on a resin portion of the substrate. Cleaning the backside or inactive surface of the semiconductor die and gelling the die attach material soon after dispensing are probably the next most effective steps in reducing the extent of delamination and package cracking in semiconductor devices, followed by cleaning the substrate and die attach material following cure and prior to encapsulation by a molding compound. Again, however, to achieve the most moisture resistant semiconductor device (e.g. a device having a Level 1 or Level 2 performance rating), it is preferred that each of the processing steps herein described, and that each of the interfaces herein targeted, are addressed in the manufacturing process.

Thus, it is apparent that there has been provided in accordance with the invention a method for making a moisture resistant semiconductor device having an organic substrate that fully meets the need and advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for making a moisture resistant semiconductor device comprising the steps of:

providing an organic substrate having a top surface, a bottom surface, a plurality of conductive traces terminating into a plurality of bonding pads on the top surface, a die receiving pad on the top surface, and a chemically created oxide layer on the die receiving pad;

dispensing a silicone-based die attach material on the chemically created oxide layer of the die receiving pad;

providing a semiconductor die placing the semiconductor die on the silicone-based die attach material within the die receiving area;

curing the silicone-based die attach material;

electrically coupling the semiconductor die to the plurality of bonding pads; and encapsulating the semiconductor die and portions of the top surface of the organic substrate with a plastic.

2. The method of claim 1 wherein the step of providing an organic substrate comprises providing an organic substrate wherein the plurality of conductive traces, the plurality of bonding pads and the die receiving pad comprise copper, wherein the plurality of conductive traces further comprises a plating layer, and wherein the chemically created oxide layer is formed on the die receiving pad without being formed on the plurality of bonding pads.

3. The method of claim 1 wherein the step of providing an organic substrate comprises providing an organic substrate wherein the chemically created oxide layer is a cuprous oxide layer.

4. The method of claim 1 wherein the step of providing an organic substrate comprises providing an organic substrate wherein the chemically created oxide layer is a cupric oxide layer.

5. The method of claim 1 further comprising the step of gelling the silicone-based die attach material within three minutes after dispensing to prevent excessive bleed.

6. The method of claim 1 wherein the step of providing an organic substrate comprises providing an organic substrate wherein the die receiving pad has a quadrangle shape and is a solid metal pattern where the top surface of the organic substrate is continuous, and wherein the step of placing the semiconductor die comprises placing the semiconductor die so that the top surface of the organic substrate, where continuous, is fully metallized beneath the semiconductor die.

7. The method of claim 1 further comprising the step of cleaning a mounting surface of the semiconductor die prior to the step of placing the semiconductor die.

8. The method of claim 1 further comprising the step of cleaning the silicone-based die attach material after the step of curing the silicone-based die attach material.

9. The method of claim 8 wherein the step of cleaning the silicone-based die attach material comprises cleaning in an environment of ultraviolet radiation and ozone.

10. A method for making a moisture resistant semiconductor device comprising the steps of:

providing an organic substrate having a surface, a plurality of conductive traces formed on the surface, a die receiving area, and a die receiving pad formed on the surface within the die receiving area, wherein the plurality of conductive traces are formed of copper having an overlying plating layer, wherein the die receiving pad is formed of copper having a chemically created oxide layer, and wherein the die receiving pad is a solid metal pattern within the die receiving area where the surface is continuous;

providing a semiconductor die;

dispensing a silicone-based die attach material on the die receiving pad;

attaching the semiconductor die to the die receiving pad using the silicone-based die attach material;

electrically coupling the semiconductor die to the plurality of conductive traces; and encapsulating the semiconductor die and portions of the surface of the organic substrate with a resin molding compound.

11. The method of claim 10 further comprising the step of cleaning the semiconductor die using ultraviolet radiation prior to the step of attaching.

12. The method of claim 11 wherein the step of cleaning comprises cleaning the semiconductor die to achieve a degree of cleanliness on a backside of the semiconductor die, wherein the degree of cleanliness is measured as a contact angle of dispensed water of less than ten degrees.

13. The method of claim 10 further comprising the step of gelling the silicone-based die attach material within three minutes after the step of dispensing.

14. The method of claim 10 wherein as a result of attaching the semiconductor die a fillet of the silicone-based die attach material is formed around a perimeter of the semiconductor die, and further comprising the step of cleaning the fillet prior to the step of encapsulating.

15. The method of claim 14 wherein the step of cleaning the fillet comprises cleaning the fillet using ultraviolet radiation.

16. The method of claim 14 wherein the step of cleaning the fillet comprises cleaning the fillet using ozone.

17. A method for making a moisture resistant semiconductor device comprising the steps of:

providing a semiconductor die, the semiconductor die having an active frontside and an inactive backside;

cleaning the inactive backside of the semiconductor die;

providing an organic substrate having a top surface, a bottom surface, a pattern of metal traces on the top surface, a die receiving pad larger in area than the semiconductor die and formed of a solid metal pattern where the top surface is continuous, and an oxide layer formed on an entirety of the die receiving pad;

dispensing a silicone-based die attach material on the die receiving pad;

mounting the semiconductor die on the die receiving pad using the silicone-based die attach material;

gelling the silicone-based die attach material within three minutes after the step of dispensing to prevent excessive bleed;

curing the silicone-based die attach material; electrically coupling the semiconductor die to the pattern of metal traces; and encapsulating the semiconductor die and portions of the top surface of the organic substrate with a resin.

18. The method of claim 17 wherein the step of cleaning comprises cleaning the inactive backside of the semiconductor die in an environment of ultraviolet radiation and ozone.

19. The method of claim 18 further comprising the step of cleaning exposed portions of the silicone-based die attach material, after the step of mounting the semiconductor die and before the step of encapsulating.

20. The method of claim 19 wherein the step of cleaning exposed portions of the silicone-based die attach material comprises cleaning in an environment of ultraviolet radiation and ozone.

21. The method of claim 17 wherein the step of providing an organic substrate comprises providing an organic substrate wherein the oxide layer on the die receiving pad is comprised of an oxide selected from a group consisting of cupric oxide and cuprous oxide.

* * * * *